United States Patent [19]

Kastner et al.

[11] Patent Number: 4,910,630

[45] Date of Patent: Mar. 20, 1990

[54] METHOD AND APPARATUS FOR ENERGIZING AN ELECTRICAL LOAD

[75] Inventors: Michael Kastner, Wolfsburg; Reinhold Brosinger, Ingolstadt; Reiner Roth, Gaimersheim, all of Fed. Rep. of Germany

[73] Assignee: Audi AG., Ingolstadt, Fed. Rep. of Germany

[21] Appl. No.: 334,179

[22] Filed: Apr. 6, 1989

[30] Foreign Application Priority Data

Apr. 29, 1988 [DE] Fed. Rep. of Germany ....... 3814551

[51] Int. Cl.$^4$ ................................................ H02H 3/08
[52] U.S. Cl. ..................................... 361/87; 307/10.1; 307/10.7; 340/438
[58] Field of Search ..................... 361/87, 93; 307/10.1, 307/10.7; 340/52 R, 438, 455

[56] References Cited

U.S. PATENT DOCUMENTS 4,733,100 3/1988 Nuscirat et al. ............... 307/10.7 X
4,761,631 8/1988 Hwang ........................... 307/10.7 X

FOREIGN PATENT DOCUMENTS 3520985 12/1986 Fed. Rep. of Germany.
3712629 10/1987 Fed. Rep. of Germany.

Primary Examiner—Derek S. Jennings
Attorney, Agent, or Firm—Karl Hormann

[57] ABSTRACT

A method and apparatus for controlling the consumption of electrical current exceeding the total generating capability of an electrical system and for monitoring the charge of a storage battery between maximum and minimum levels and for disconnecting electrical loads in response to the level reaching the minimum.

16 Claims, 3 Drawing Sheets

METHOD AND APPARATUS FOR ENERGIZING AN ELECTRICAL LOAD

BACKGROUND OF THE INVENTION

1. Field of the Invention

The invention in general relates to a method of and an apparatus for controlling the energization of an electrical load in circumstances where the supply of current is limited and electrical energy reserves have to stay within certain limits, and more particularly to such a method and apparatus for controlling the energizing of an electrical load the current consumption of which exceeds the current generating capability of the electrical system to which it is connected without discharging a storage battery below a predetermined level.

2. Description of the Prior Art

Automotive vehicles are equipped with a current generator or alternator for generating current and with a storage battery. While the current produced by the generating equipment is in normal circumstances sufficient to satisfy all the requirements of the electrical system of the vehicle, it is, nevertheless, limited. For at times the current required by the system may exceed the current generated. In such circumstances the difference may be supplied, at least for a limited time, from the battery.

For instance, the temporary energization of a heatable windshield may add a load to the electrical system which may consume current exceed the generating capability of the generator. The excess would have to be drawn from the battery in a manner well known. However, unless carefully monitored, this could lead to lowering the battery charge to a level too low to restart the engine after it has been cut.

3. Objects of the Invention

Therefore, it is an object of the invention to provide a method of and apparatus for preventing an excessive discharge of a battery.

Another object of the invention resides in the provision of a method and apparatus for preventing excessive discharge of a battery where current required to feed electrical loads is in excess of current generated.

A further object of the invention resides in providing a method and an apparatus for use in an automotive vehicle for preventing excessive current drain from a battery where temporarily activated electrical loads require current in addition to the total capacity the generating equipment is capable of providing.

Yet another object of the invention is to provide a method and an apparatus for monitoring excessive current consumption and temporarily reducing such consumption in response to the charge level of a battery being lowered to a predetermined level.

Still another object of the invention resides in the provision of a method and apparatus for disconnecting an electrical load from an electrical system of an automotive vehicle in response to signals indicating a predetermined level of charge of the battery.

A more general object of the invention resides in the provision of a method and apparatus for establishing values representative of upper and lower charge levels of a battery.

It is also an object of the invention to provide a method of an apparatus for simulating predetermined maximum and minimum charge levels of an electrical storage battery in an automotive vehicle and in response to the minimum charge level to disconnect predetermined current consuming equipment.

Other objects of the invention will in part be obvious and will in part appear hereinafter. The invention accordingly comprises a method and apparatus possessing the construction, combination of elements and arrangement of parts which are exemplified in the following detailed disclosure.

SUMMARY OF THE INVENTION

These and other objects are accomplished by a method comprising the steps of measuring the operating time of a vehicle while a high current drain accessory is switched off, deriving from this operating time a value representative of the charge level of the battery, modifying this value while the accessory is switched on, and switching off the accessory when a predetermined threshold value has been reached.

In accordance with the invention the circuitry for practicing the method may comprise means for counting in a first direction to a predetermined first threshold value while the high current drain accessory it not in operation and for counting in the opposite direction to a predetermined second threshold value when the high current drain accessory is operating, and means for disconnecting the high current drain accessory when the second threshold value has been reached.

DESCRIPTION OF THE DRAWING

The novel features which are considered characteristic of the invention are set forth with particularity in the appended claims. The invention itself, however, in respect of its organization and method of operation, together with other objects and advantages of the illustrated embodiment when read in connection with the accompanying drawings, in which:

DESCRIPTION OF THE PREFERRED EMBODIMENT

Figure 1:
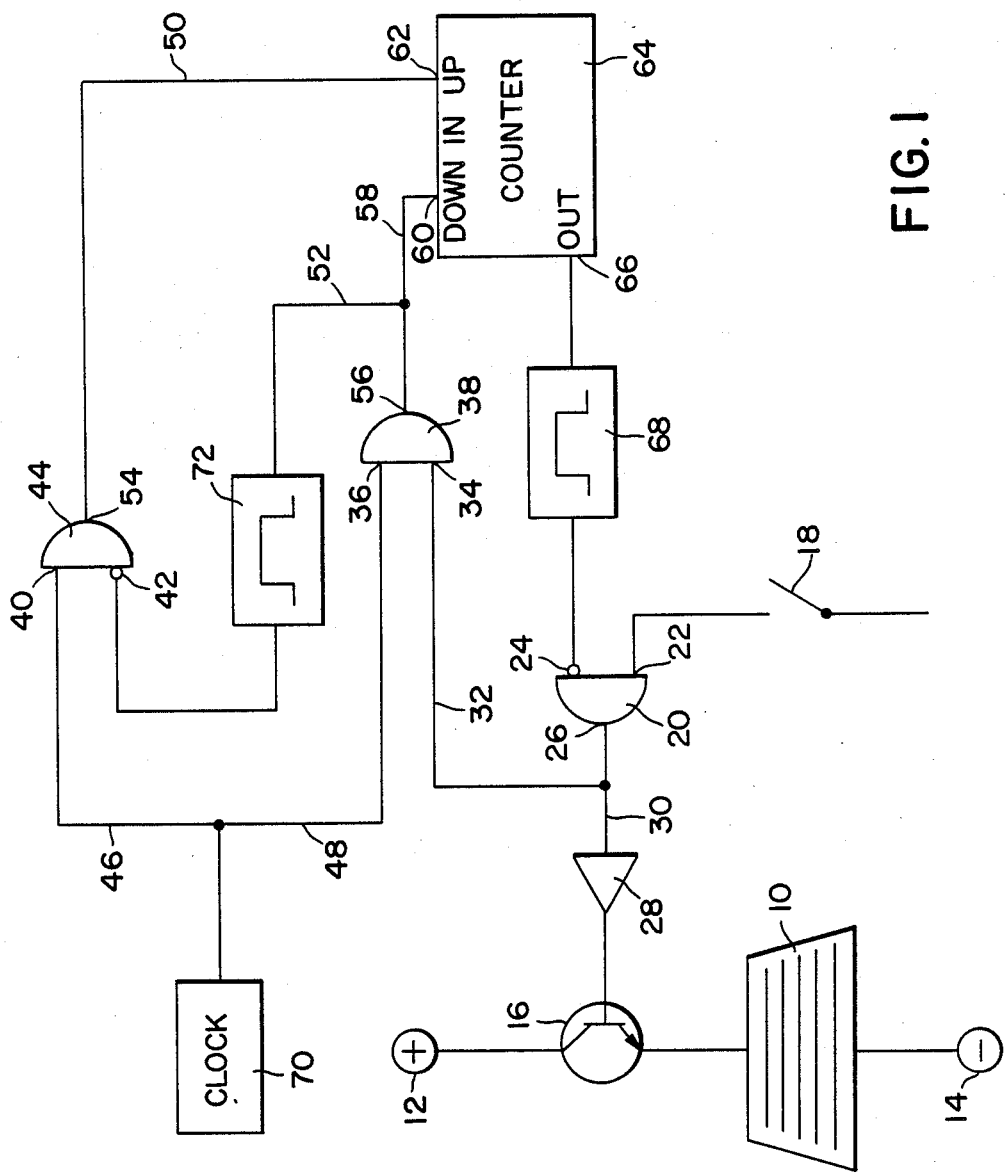
FIG. 1 schematically depicts a first embodiment of a control circuitry for executing the present invention.

An electrical load, schematically depicted as an electrically heatable windshield 10 is connected to positive and negative terminals 12 and 14, respectively, of a current source. For purposes of this description the current source may comprise a current generator and a storage battery (neither shown) suitably connected to each other and to the positive terminal 12 so that at times the generator may charge the battery and at times either or both may energize the electrical system in a manner well known in the art. A switch 16, for instance a transistor, may selectively open and close the circuit between the positive voltage terminal 12 and the windshield 10 in a manner to be described. Those skilled in the art will appreciate that other electrical loads may take the place of the heatable windshield 10.

Since the current drawn by the windshield 10 in addition to all the other loads of the system may exceed the total current generating capability of the generator, the additional requirement would be drawn from the battery to compensate for the resulting deficiency. However, in order to prevent excessive discharge of the battery in such circumstances, the invention provides for the logic control circuit means as well as a method of its operation to be described.

By way of example, the logic circuit in accordance with the invention shown in FIG. 1 may be arranged as follows: Collector and emitter of the transistor 16 are connected to the positive terminal 12 and the windshield 10, respectively, the base of the transistor 16 being connected, by a line 30, to a driver stage 28 which in turn is connected to the output terminal 26 of an AND gate 20. One input terminal 22 of the AND gate 20 is connected to a manual on-off switch 18. The on-off switch 18 may be used for energizing the windshield 10 in the manner of this invention. Closing the switch 18 results in a logic 1 signal being applied to the input terminal 22 of the AND gate 20.

The other input terminal 24 of the AND gate 20 is inverted and is connected to an output terminal of a one-shot multivibrator 68. The one-shot multivibrator 68 may be triggered by a signal from the output terminal 66 of an up/down counter 64.

The output terminal 26 of the AND gate 20 is also connected, by way of a line 32, to one input terminal 34 of another AND gate 38. The other input terminal 36 of the AND gate 38 is connected to a clock oscillator 70 by way of a line 48.

The output terminal 56 of the AND gate 38 is connected, by a line 58, to the down-count input terminal 60 of the up/down counter 64. The output terminal 56 of the AND gate 38 is also connected to the input of another one-shot multivibrator 72. The output of the multivibrator 72 is in turn connected to an inverted input terminal 42 of a further AND gate 44. The other input terminal 40 of the AND gate 44 is connected to the oscillator 70 by way of line 46, and the output terminal 54 of the AND gate 44 is connected to the up-count terminal 62 of the up/down counter 64 by way of a line 50.

The operation of the control circuit is as follows: The up/down counter 64 comprises a non-volatile memory capable of retaining stored counts after the vehicle has been turned off and the circuit is no longer energized. For purposes of explaining the operation of the circuit it is assumed that the count initially stored in the counter exceeds zero. An initial count of zero is a special condition to be described infra.

When the count in the counter 64 exceeds zero a logic 0 signal is present at its output terminal 66. The one-shot multivibrator 68 cannot therefore be triggered and, with current being switched on, its logic 0 output is inverted to a logic 1 signal at the input terminal 24 of the AND gate 20.

When for purposes of switching on the heatable windshield 10 the manual switch 18 is closed, the input terminal 22 of the AND gate 20 will transition to logic 1. The output of the AND gate 20 will then go to logic 1, and the driver stage 28 will gate the transistor 16 into conduction. Once the transistor 16 is conducting the windshield 10 will be energized by current flowing through it from the positive terminal 12 to the negative terminal 14.

The logic 1 signal from the output terminal of AND gate 20 will also be applied to the input terminal 34 of the AND gate 38 by way of line 32. The other input terminal 36 of the AND gate 38 receives a train of pulses of predetermined frequency from the oscillator 70 by way of line 48. These pulses are applied to the down-count terminal 60 of the up/down counter 64.

By way of line 52 the output 56 of AND gate 38 also triggers the one-shot multivibrator 72. The pulsewidth of the one-shot multivibrator 72 exceeds the pulse frequency of the oscillator 70. Thus, the one-shot multivibrator 72 is triggered by a pulse from the AND gate 38, but before it can revert to its initial state the one-short multivibrator 72 will have received another trigger pulse so that its output remains at logic 1. The logic 1 signal from the one-shot multivibrator 72 is inverted at the input terminal 42 of the AND gate 44. The output 54 of the AND gate 44 thus is a logic 0 signal. By line 50 the logic 0 signal is applied to the up-count terminal 62 of the up/down counter 62.

As soon as the windshield 10 is turned on by closure of the manual switch 18, the counter 64 will commence to count down from its initial count, at the pulse frequency of the oscillator 70.

As soon as the counter 64 has counted down to zero its output 66 changes to a logic 1signal. The logic 1 signal triggers the one-shot multivibrator 68 and its resulting logic 1 output signal will be inverted at the input 24 of the AND gate 20 to a logic 0 signal. Thus, the output of the AND gate 20 changes to a logic 0 signal, and the transistor 16 is turned off. This disconnects the windshield 10 from the current source for the duration of the transition period of the one-shot multivibrator 68. The pulse width or transition period of the multivibrator 68 is a relatively long one lasting, for example, in the order of several minutes.

The logic 0 signal from the AND gate 20 is simultaneously fed to the input terminal 34 of the AND gate 38 by way of line 32. The output 56 of the AND gate 38 therefore transitions to a logic 0 signal.

Thus, the AND gate 38 no longer passes the pulses from the clock oscillator 70 to the down-count input terminal 60 of the counter 64 and to the one-shot multivibrator 72. As a result, the output of the multivibrator 72 transitions to a logic 0 signal which is inverted to a logic 1 signal at the input 42 of the AND gate 44. The latter thus passes the pulses received at its input terminal 40 form the oscillator 70 along line 46 to the up-count terminal 62 of the up/down counter 64 by way of line 50. As long as the AND gate 20 and, therefore, the windshield 10 remain turned off the counter 64 counts up at the same frequency at which it previously counted down.

When at the end of its transition the multivibrator 68 reverts to its logic 0 output signal and the switch 18 is closed, the transistor 16 will be turned on again and heating of the windshield 10 will recommence in the manner described supra.

Accordingly, the windshield 10 is disconnected after an operational interval the length of which is a function of the count in the counter 64 even while the switch 18 is closed. During a period of recuperation determined by the pulsewidth of the one-shot multivibrator 68 the battery may be recharged, before the windshield 10 is automatically turned on again.

In the event the switch 18 is open, the output of the AND gate 20 is at logic 0 because its input terminal 22 is at logic 0. Therefore, the input 34 of the AND gate 38 is also at logic 0 and the up/down counter 64 counts up for reasons described above.

The highest count storable in the non-volatile memory of the counter 64 corresponds substantially to the maximum charge level of the battery. Once the maximum count has been reached the upward count is suspended because the battery cannot be charged beyond its capacity.

On the other hand, a zero count in the memory of the counter represents the lowest level of battery charge tolerable for safe operating conditions of the vehicle. That is to say that even at this low level the battery is powerful enough to start the engine, for instance. Therefore, while the counter is counting down the discharging of the battery is acceptable. Thereafter, the windshield 10 is switched off. If because of prior operating conditions, such as prior operation of the windshield 10, the count in the memory of the counter 64 is low, the apparatus of the invention would limit discharging of the battery for a correspondingly shorter period.

Those skilled in the art will appreciate that the circuit in accordance with the invention may be adapted or modified to suit particular circumstances. For instance, the embodiment depicted in FIG. 2, while being similar to the embodiment of FIG. 1 in major respects, utilizes two clock oscillators 70' and 70" for the purpose of feeding pulse trains of different frequencies to the up-count and down-count terminals 62 and 60 of the counter 64, respectively.

Figure 3:
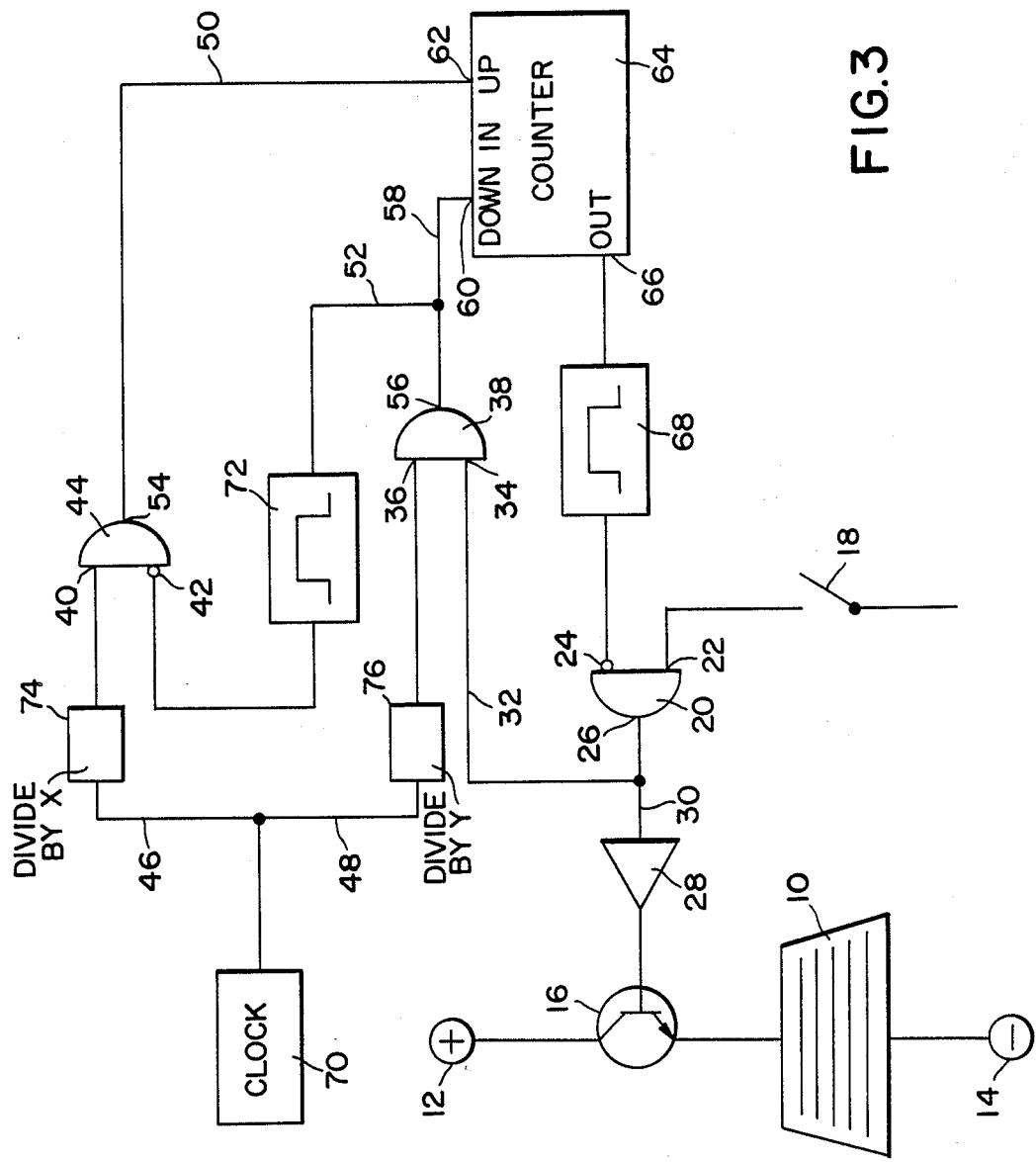
FIG. 3 is a third embodiment of a circuit in accordance with the invention.

FIG. 3 depicts an embodiment with divider circuits 74 and 76 connected between the output of a single clock oscillator 70 and the inputs 40 and 36 of the AND gates 44 and 38, respectively. Divider circuit 74 divides the pulse frequency of the clock oscillator 70 by a first multiple, X, thereof, and the divider circuit 76 divides the clock frequency by a second multiple, Y, thereof.

Figure 2:
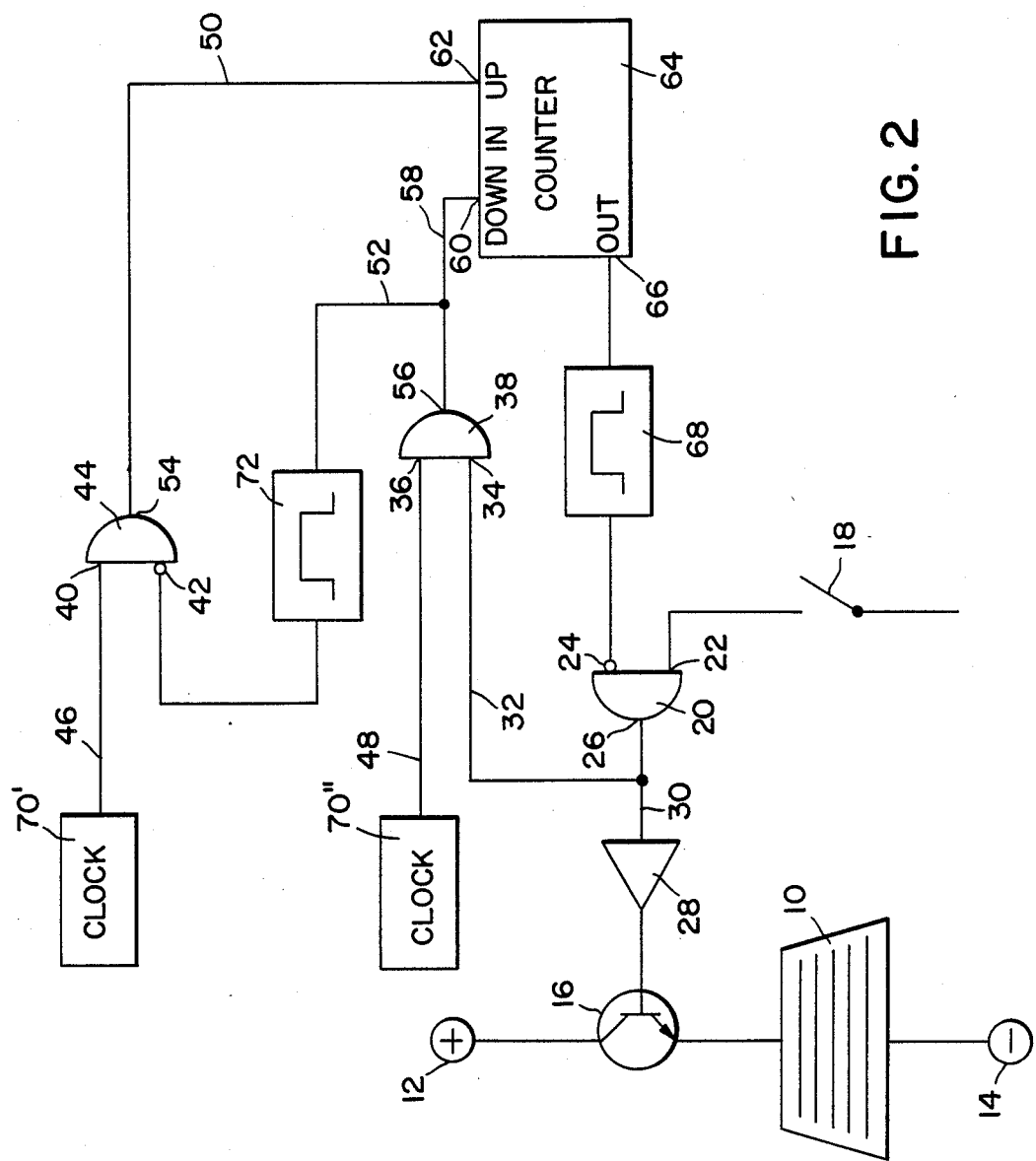
FIG. 2 is an alternate embodiment of a circuit in accordance with the invention.

Thus, while the embodiment of FIG. 1 provides for counting up and down at substantially identical pulse frequencies, the embodiments of FIG. 2 and 3 permit up and down counts at different frequencies. In this connection, it may in certain circumstances be desirable to count down at a relatively slow rate and to count up at a relatively fast rate, or vice versa. Persons skilled in the art would know which one of the two frequencies in any particular circumstance should be the higher one.

The length of the interval during which the windshield 10 remains switched off during operation of the circuit may be varied by adjusting the transition period of the one-shot multivibrator 68.

Other modes of operation would be possible. For instance, it would also be within the ambit of the invention to vary the pulse frequency fed to input terminals 60 and 62 of the counter 64 as a function of the total electrical load connected to the electrical system at any time, so that as the load increases the frequencies of the up-count and of the down count are respectively increased and decreased, or vice versa. Also, the maximum count storage in the counter 64 may be made adjustable as a function of such operating parameters as ambient temperature, battery size and/or age.

Furthermore, for practicing the invention other circuit configurations would be possible. For instance, operating cycles of the vehicle with the windshield 10 deactivated may be read into a memory and may be multiplied by the current available from the generator after all other loads have been deducted. Operating cycles of the vehicle with the windshield 10 activated would be stored in a second memory and may be multiplied by maximum current drain. The difference between the two values could be fed to a comparator for comparison with a predetermined minimum value. If the minimum value is less than the difference, the windshield would be disconnected, and vice versa.

It will thus be seen that the invention provides for an effective method and apparatus for preventing the discharge of an electrical storage battery below a predetermined minimum level in circumstances in which the current generating capacity lags behind current consumption.

Other embodiments of the invention, including additions, subtractions, deletions and other modifications of the preferred disclosed embodiment will be obvious to those skilled in the art and are within the scope of the appended claims.

What is claimed is:

1. An apparatus for selectively connecting a load to an electrical system including generating means and storage battery means, the energy consumption of the system exceeding its generating capacity when said load is connected to said system, comprising:
    means for generating a first value representative of current generated during a predetermined interval while said load is disconnected from said system;
    means for storing said value;
    means for connecting said load to said system in response to said first value;
    means for modifying said first value to a second value in response to said load being connected to said system; and
    means responsive to said second value for disconnecting said load from said system.

2. The apparatus of claim 1, wherein said first value comprises a range between maximum and minimum values at least one of which is different from said second value.

3. The apparatus of claim 2, wherein said storing means comprises non-volatile memory means.

4. The apparatus of claim 3, wherein said means for generating said first value comprises first pulse generating means.

5. The apparatus of claim 4, wherein said memory means comprises counting means connected to said first pulse generating means for counting in a first direction.

6. The apparatus of claim 5, wherein said modifying means comprises second pulse generating means connected to said counting means for counting in a direction opposite said first direction.

7. The apparatus of claim 6, wherein said first value is representative of a given battery charge level and said second value is representative of a battery charge level less than said given charge level.

8. The apparatus of claim 7, wherein said memory means comprises output means connected to switch means for connecting said load to said system in the presence of said first value and for disconnecting said load from said system in response to said second value.

9. The apparatus of claim 8, wherein said switch means includes a transistor.

10. The apparatus of claim 9, wherein said first and second pulse generating means comprises oscillating means.

11. The apparatus of claim 10, wherein said counting means counts at identical rates in said first and opposite directions.

12. The apparatus of claim 11, wherein said first and second pulse generating means comprises single oscillating means selectively connectable to said counting means for counting in said first direction by first gate means responsive to said second value and in said opposite direction by gate means responsive to said first value.

13. The apparatus of claim 10, wherein said counting means counts at a first rate in said first direction and at a second rate in said opposite direction.

14. The apparatus of claim 13, wherein said pulse generating means comprises a single oscillating means connected to said counting means by first divider circuit means for counting in said first direction and by second divider circuit means for counting in said opposite direction.

15. The apparatus of claim 13, wherein said pulse generating means comprises separate oscillating means oscillating at different frequencies.

16. A method of controlling the energization of a load selectively connectable to an electrical system including current generating means and storage battery means, the current consumption of the system exceeding its generating capability when said load is connected, comprising the steps of monitoring current generated for a predetermined interval while said load is disconnected from said system;

generating a first value representative of the current generated during said interval;

storing said first value;

connecting said load to said system in response to said first value;

modifying said first stored value to a second value while said load is connected to said system; and disconnecting said load from said system in response to said second value.

* * * * *